(12) United States Patent
Cabral, Jr. et al.

(10) Patent No.: US 7,217,655 B2
(45) Date of Patent: May 15, 2007

(54) ELECTROPLATED COWP COMPOSITE STRUCTURES AS COPPER BARRIER LAYERS

(75) Inventors: Cyril Cabral, Jr., Mahopac, NY (US); Stefanie R. Chiras, Peekskill, NY (US); Emanuel I. Cooper, Scarsdale, NY (US); Hariklia Deligianni, Tenafly, NJ (US); Andrew J. Kellock, Sunnyvale, CA (US); Judith M. Rubino, Ossining, NY (US); Roger Y. Tsai, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/047,652

(22) Filed: Feb. 2, 2005

(65) Prior Publication Data

US 2005/0127518 A1    Jun. 16, 2005

Related U.S. Application Data

(62) Division of application No. 10/714,966, filed on Nov. 18, 2003.

(51) Int. Cl.
*H01L 21/4763* (2006.01)
(52) U.S. Cl. ............ 438/642; 438/637; 438/648; 438/675; 438/687; 257/E21.585
(58) Field of Classification Search .............. None
See application file for complete search history.

(56) References Cited

U.S. PATENT DOCUMENTS

| | | | |
|---|---|---|---|
| 5,695,810 A | 12/1997 | Dubin et al. | |
| 6,323,128 B1 | 11/2001 | Sambucetti et al. | |
| 6,342,733 B1 | 1/2002 | Hu et al. | |
| 6,528,409 B1 | 3/2003 | Lopatin et al. | |
| 6,573,606 B2 | 6/2003 | Sambucetti et al. | |

(Continued)

OTHER PUBLICATIONS

A. Kohn, et al., "Characterization of electroless deposited Co(W,P) thin films for encapsulation of copper metallization" Materials Science and Engineering A302 (2001) pp. 18-25.

(Continued)

*Primary Examiner*—Michael Lebentritt
*Assistant Examiner*—Cheung Lee
(74) *Attorney, Agent, or Firm*—Conolly Bove Lodge & Hutz LLP; Robert M. Trepp

(57) ABSTRACT

A composite material comprising a layer containing copper, and an electrodeposited CoWP film on the copper layer. The CoWP film contains from 11 atom percent to 25 atom percent phosphorus and has a thickness from 5 nm to 200 nm. The invention is also directed to a method of making an interconnect structure comprising: providing a trench or via within a dielectric material, and a conducting metal containing copper within the trench or the via; and forming a CoWP film by electrodeposition on the copper layer. The CoWP film contains from 10 atom percent to 25 atom percent phosphorus and has a thickness from 5 nm to 200 nm. The invention is also directed to a interconnect structure comprising a dielectric layer in contact with a metal layer; an electrodeposited CoWP film on the metal layer, and a copper layer on the CoWP film.

25 Claims, 6 Drawing Sheets

U.S. PATENT DOCUMENTS

| | | | |
|---|---|---|---|
| 6,972,251 B2 * | 12/2005 | Ning | 438/622 |
| 2003/0010645 A1 | 1/2003 | Ting et al. | |
| 2003/0075808 A1 | 4/2003 | Inoue | |
| 2004/0235237 A1 * | 11/2004 | Inoue et al. | 438/232 |

OTHER PUBLICATIONS

C.-K. Hu, et al., "Reduced electromigration of Cu wires by surface coating" IBM T.J. Watson Research Center, Yorktown Heights, New York.

P.L. Cavallotti, et al., "Microelectrodeposition of cobalt and its alloys" Proceedings AESF SUR/FIN Annual International Technical Conference, 1999, pp. 325-335.

C.-K. Hu, et al., "Electromigration in On-Chip Single/Dual Damascene Cu Interconnections" Journal of the Electrochemical Society, vol. 149, No. 7, pp. 408-415, 2002.

* cited by examiner

ELECTROPLATED COWP COMPOSITE STRUCTURES AS COPPER BARRIER LAYERS

This is a divisional application of U.S. patent application Ser. No. 10/714,966, filed Nov. 18, 2003.

FIELD OF THE INVENTION

The invention is directed to electroplated cobalt tungsten phosphide-copper composite structures. The electroplated cobalt tungsten phosphide film, hereafter CoWP film, present in the composite structures can be used as a barrier layer for copper interconnect structures in a semiconductor device.

BACKGROUND OF THE INVENTION

Aluminum-copper and related alloys were once the preferred alloys for forming interconnect structures in electronic devices such as integrated circuit chips. However, the present demands of the microelectronic industry for increased density and high performance (speed and efficiency) requires that the interconnect structures consist of pure or nearly pure copper. Performance is improved because the resistivity of copper and certain copper alloys is much lower than the resistivity of aluminum-copper. Also, narrow interconnect structures (lines) can be used, thus providing higher wiring densities.

Typically, copper interconnect structures are fabricated using a damascene processing method. In this process, trenches or vias are formed in a dielectric layer on a silicon wafer and then a metal liner (e.g. TaN/Ta) and a copper seed layer are deposited in the trenches/vias. The trenches/vias are further filled with copper. Chemical mechanical polishing (CMP) is then used to remove the copper overburden thereby providing a clean top copper surface coplanar with the dielectric layer. An etch stop or capping material such as $SiN_x$, or a dielectric containing silicon, carbon and optionally nitrogen, is then deposited on the polished surfaces.

Many types of materials to cap copper have been proposed including both electroless and electrolytically plated metals as well as physical vapor deposited metal and organic-based capping materials. PVD or CVD capping materials are not selective and require a CMP or etching step to remove the film from the dielectric. Selective electroless deposition of some metal alloys, in particular of CoWP, has been shown to significantly improve electromigration lifetime, see Hu et al., "Reduced Electromigration of Cu Wires by Surface Coating." *Applied Physics Letters*, 81(10), 2002, p. 1782. However, electroless processes typically require a seeding scheme (to start the nucleation of the deposit) as well as high plating temperatures, and are difficult to control especially for films less than 300 Å thick.

Electromigration and diffusion of copper through the capping material occurs primarily along the grain boundaries of the capping material. C.-K. Hu & al., "Electromigration in On-Chip Single/Dual Damascene Cu Interconnections", *J. Electrochem. Soc.* 149, G408 (2002); C.-K. Hu & S. Reynolds, "CVD Cu Interconnections and Electromigration", *Electrochem. Soc. Procs. Vol.* 97–25 (1997), p. 1514). As a result, it is desirable to optimize a capping material so as to minimize the grain boundary area and/or to lengthen the diffusion path along the existing grain boundaries. As explained by A. Kohn et al., in "Characterization of Electroless Deposited Co(W,P) Thin Films for Encapsulation of Copper Metallization", *Materials Science and Engineering* A302 (2001) p. 18–25, the reasons for the observed difference in the diffusion barrier quality of PVD cobalt and electroless CoWP films is the result of the degree of crystallization and grain size in the two materials. "Single crystalline materials are expected to function as the best diffusion barriers because at low temperatures bulk diffusion is extremely small, and there are no grain boundaries for fast diffusion. However, deposition of single crystalline thin films can not yet be technologically realized. Consequently, the preferred microstructure of thin films for diffusion barrier applications is amorphous as it eliminates the fast diffusion paths along the grain boundaries." Id., page 21.

Although amorphous materials are, in principle, very attractive for use as capping materials, many attempts by skilled researchers to obtain effective amorphous materials have failed. Attempts to optimize process conditions for existing amorphous materials have either provided materials that interdiffuse with copper too extensively to be of use (e.g., electroless NiP) or crystallize easily on heating, that is, at annealing temperatures of about 400° C. or greater. An optimal capping material will also have good adhesion to the copper conductor, and be a relatively thin, continuous film.

U.S. Pat. No. 5,695,810 describes the use of electroless deposited CoWP films as barrier layers including as a capping material for copper interconnect structures. One stated advantage of using an electroless deposited CoWP film for a barrier layer is that copper can be electrolessly deposited on CoWP without the need for an activation (seed) layer. The patent also appreciates that a slight amount of tungsten in the range of 2 to 7 atomic percent in the CoWP film can improve the barrier properties of the film over that of a cobalt phosphide film. The tungsten atoms preferentially become positioned at the grain boundaries. This observed effect is generally referred to as "stuffing" the grain boundaries of the CoP film.

However, as emphasized by Kohn, electroless deposited CoWP films are limited to about 8 to 10 atomic percent phosphorous. Also, electroless deposited films tend to be more crystalline than amorphous, and upon annealing the crystallinity of the film increases even further.

Rather than trying to improve upon the barrier properties of electroless deposited CoWP films, which by their nature are 1) limited to a maximum phosphorous content of 8 to 10 atomic percent, and 2) crystalline, Applicants sought a different approach to forming CoWP thin films in conjunction with adjacent copper conducting layers, in particular, copper interconnect structures.

SUMMARY OF THE INVENTION

The invention is directed to a composite material comprising a layer containing copper and an electrodeposited CoWP film on the copper layer. The CoWP film contains from 11 atom percent to 25 atom percent phosphorus and has a thickness from 5 nm to 200 nm.

The invention is also directed to a method of making an interconnect structure comprising: providing a trench or via within a dielectric material and a conducting metal containing copper within the trench or the via, and forming a CoWP film by electrodeposition on the copper layer. The CoWP film contains from 10 atom percent to 25 atom percent phosphorus and has a thickness from 5 to 200 nm.

The invention is also directed to an interconnect structure comprising: a dielectric layer in contact with a metal layer; an electrodeposited CoWP film on the metal layer; and a copper layer on the CoWP film. The CoWP film contains 11 atom percent to 25 atom percent phosphorus and has a thickness from 5 nm to 200 nm.

The invention is also directed to an interconnect structure comprising: a trench or a via disposed within a dielectric material, wherein the trench or via is filled by a metal layer disposed along the sidewalls of the trench or the via, a conducting layer containing copper disposed on the metal layer; and a capping material disposed on the copper layer. The capping material is an electodeposited CoWP film that contains 11 atom percent to 25 atom percent phosphorus and has a thickness from 5 nm to 200 nm.

BRIEF DESCRIPTION OF THE DRAWINGS

This invention will be better understood by reference to the Detailed Description of the Invention when taken together with the attached drawings, wherein.

DETAILED DESCRIPTION OF THE INVENTION

Figure 1:
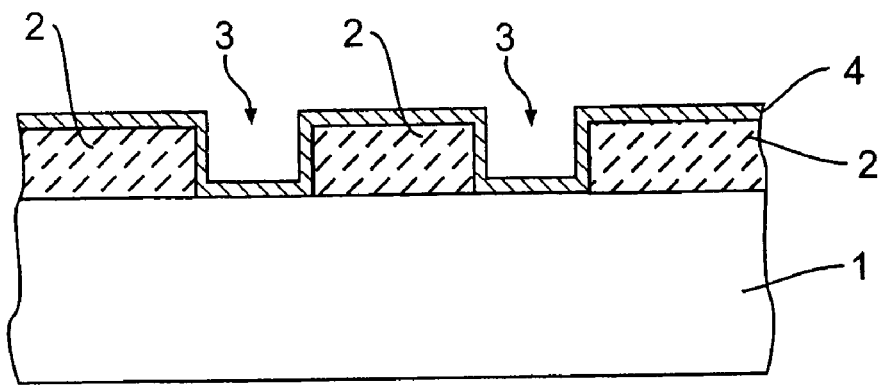
FIG. 1 is a schematic representation of an interconnect structure known in the art.

Applicants sought an approach that would allow them to increase the maximum amount of phosphorous and tungsten in CoWP films. Another one of their goals was to obtain deposited amorphous CoWP films instead of the crystalline CoWP films obtained by electroless deposition. However, just obtaining a deposited amorphous CoWP film is not sufficient to provide an efficient barrier layer for copper. One must also show that the deposited amorphous layer remains amorphous at temperatures exceeding 300° C., and in most cases at temperatures at or exceeding 400° C. Often, an amorphous CoWP film will crystallize under such thermal conditions. Therefore, Applicants sought a process that not only provided an amorphous deposited CoWP film, but also, an amorphous CoWP film that would not crystallize to an appreciable extent upon a thermal anneal. Applicants set out to determine whether thermally stable, amorphous CoWP films could be obtained using an electrodeposition process. Electroplating has the advantage of lower process temperatures and often provides more uniform films with a thickness from 5 nm to 200 nm. Electroplating would also provide greater process control and possibly a greater compositional range of the respective elements than corresponding CoWP films prepared by electroless deposition.

Electrolytically deposited CoWP films can be either crystalline or amorphous. Crystalline films tend to be strongly textured with grain boundaries perpendicular to the copper underlayer. As a result, the orientation of the grain boundaries is undesirable for diffusion control and electromigration of copper through the barrier layer. With respect to electroplated amorphous CoWP films, Applicants soon confirmed that some of the films easily crystallized upon annealing. As a result, Applicants were required to identify specific electroplating conditions that would yield amorphous films stable against crystallization up to temperatures near or slightly above 400° C., or at least stable enough to such temperatures without generating a high density of interconnected grain boundaries.

The composite material of the invention is prepared by a process comprising providing a layer containing copper, and forming a CoWP film by electrodeposition on the copper layer. The resulting CoWP film will have a thickness from 5 nm to 200 nm, preferably from 5 nm to 50 nm, more preferably from 10 nm to 30 nm. The CoWP film contains from 10 atom percent to 25 atom percent phosphorus, from 11 atom percent to 25 atom percent phosphorus, or from 11 atom percent to 20 atom percent phosphorus, as measured by Rutherford backscattering spectroscopy.

Alternatively, the CoWP-copper composite material is prepared by a process comprising: providing a dielectric layer in contact with a metal layer; forming a CoWP film by electrodeposition on the metal layer; and forming a copper layer on the CoWP film. The resulting CoWP film will have a thickness from 5 nm to 200 nm, preferably from 5 nm to 50 nm, more preferably from 10 nm to 30 nm. The CoWP film contains from 10 atom percent to 25 atom percent phosphorus, from 11 atom percent to 25 atom percent phosphorus, or from 11 atom percent to 20 atom percent phosphorus, as measured by Rutherford backscattering spectroscopy.

The CoWP films of the invention contains from 1.5 atom percent to 10 atom percent tungsten, or from 3 atom percent to 10 atom percent tungsten, as measured by Rutherford backscattering spectroscopy. In contrast, electroless deposition of CoWP films typically limits the amount of tungsten in the film from 1 atom percent to 3 atom percent.

In one embodiment, the CoWP film consists essentially of $Co_xW_yP_z$, wherein $0.68<x<0.88$; $0.01<y<0.10$; and $z=(1-(x+y))$ as measured by Rutherford backscattering spectroscopy. In another embodiment, the CoWP film consists essentially of $Co_xW_yP_z$, wherein $0.75<x<0.85$ and $0.02<y<0.06$. In another embodiment, the CoWP film consists essentially of $Co_xW_yP_z$, wherein $0.77<x<0.83$ and $0.03<y<0.07$.

FIG. 1 is a schematic representation of a known interconnect r structure with a dielectric material 2 such as silicon dioxide on a substrate 1 (e.g. a semiconductor wafer substrate). Trenches and/or vias openings 3 are lithographically defined and formed in the dielectric material 2 by well-known techniques. It is to be understood that the present invention is not to be limited to structures formed in dual damascene openings. Rather, the opening 3 can have various configurations such as vias, trenches or single damascene openings.

Figure 2:
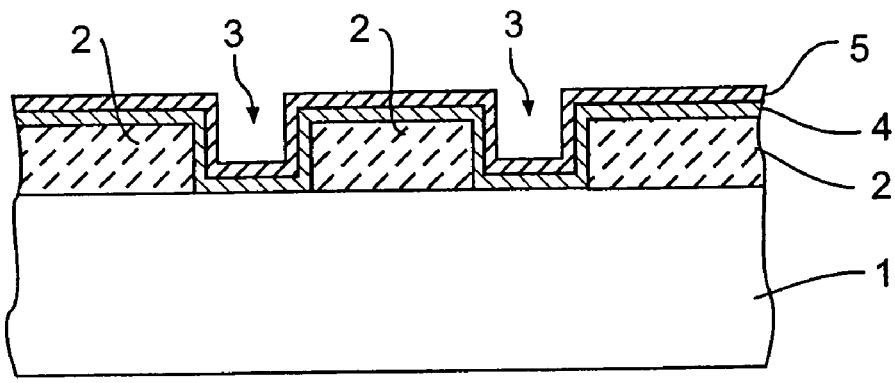
FIG. 2 is a schematic representation of an interconnect structure of FIG. 1 with a CoWP film of the invention.

According to the present invention a metal layer 4 is deposited onto the structure of FIG. 1 as illustrated in FIG. 2. The deposition is typically carried out by CVD (chemical vapor deposition) or preferably by sputtering. The sputtering is typically achieved by PVD (physical vapor deposition) or IPVD (ionized physical vapor deposition). Further discussion of the deposition of the metal layer is not deemed necessary because such processes are commonly practiced by persons skilled in the art.

The metal layer can comprise one or more layers of various metals and metal alloys. The one or more metal layers can function as a diffusion or barrier layer, and/or as an adhesion layer. Common metals and metal alloys used in the art include tantalum, tungsten, tantalum nitride, and titanium nitride. These metals are typically used as a first metal layer in contact with the dielectric layer. A second metal layer containing one or more metals selected from palladium, ruthenium, rhodium, osmium and rhenium can then be deposited on the first metal layer. The one or more metal layers are typically 10 nm to 200 nm, and more typically 50 nm to 100 nm thick.

A CoWP film 5 according to the invention is then electrodeposited deposited on metal layer 4. The CoWP film 5 will have a thickness from 5 nm to 200 nm, more typically from 5 nm to 50 nm. Some of the more preferable composite structures of the invention will have a CoWP film thickness from 10 nm to 30 nm.

The solution for electrodepositing CoWP films of the invention comprises a source of tungsten ions such as sodium or ammonium tungstate, or phosphotungstic acid; a source of cobalt ions such as cobalt chloride or cobalt sulfate; and complexing agents, surfactants and chemicals used to adjust the pH of the bath solution. An exemplary solution for electrodeposition of the CoWP film can contain $(NH_4)_2WO_4$, $CoCl_2$, $Na_3$-citrate, boric acid, Triton X-114, NaOH, and $Na_2H_2PO_2$. The pH of this solution can be adjusted by the amount of NaOH added to the bath.

The extent of complexation of $Co^{2+}$ ions and the pH of the solution are adjusted in such a way that a desired microstructure of the alloy is obtained. Through numerous experiments, Applicants discovered that the amount of cobalt, phosphorous and tungsten in the CoWP films of the invention is highly dependent upon the applied current-density (i, $mA/cm^2$) and the pH of the electroplating bath solution. As a result, the invention can provide CoWP films with a greater compositional range of the respective elements than CoWP films prepared by electroless processes.

In particular, varying the deposition current density can control the amount of tungsten in the CoWP films of the invention. The current density used to deposit the films of the invention is typically about 3 $mA/cm^2$ to about 20 $mA/cm^2$, more typically about 6 $mA/cm^2$ to about 12 $mA/cm^2$.

The amount of tungsten in the CoWP films of the invention is also dependent upon the pH of the electroplating bath solution. For example, Applicants prepared CoWP films with less than 1 atomic percent tungsten if the pH was less than 6. Increasing the pH of the electroplating bath above 7 (e.g., to apH from 8 to 10) resulted in an increase in the amount of tungsten in the film above 1 atom percent.

Following the electrodeposition of the CoWP films, the CoWP film can be annealed to temperatures exceeding 300° C., typically at about 400° C. using procedures known to those skilled in the art. The CoWP films can be annealed in the presence of forming gas (5% $H_2$ in $N_2$) at 400° C. for about four hours. The annealing electrodeposited step does not have to occur immediately following the electrodeposition of the CoWP film. Rather, the CoWP film can be annealed during any subsequent heat treatment process step.

Figure 3:
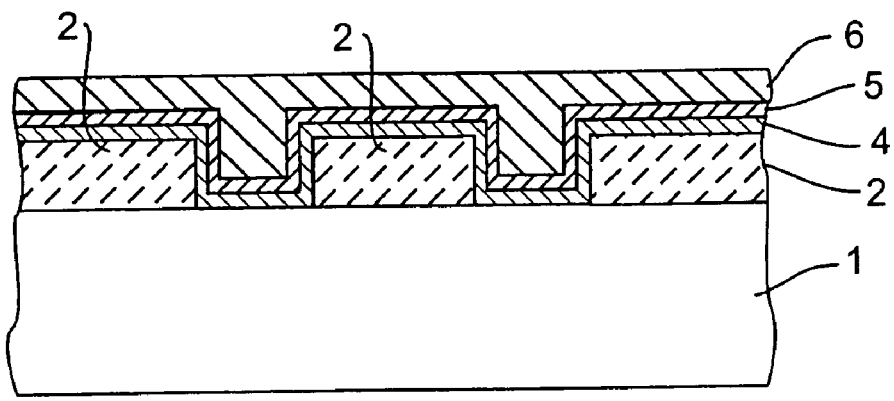
FIG. 3 is a schematic representation of an interconnect structure of FIG. 2 with copper filling the trenches.

A copper or copper alloy layer 6 is then deposited onto the CoWP film 5 as illustrated in FIG. 3. The copper can be deposited directly on CoWP film 5 without a need for a seed layer. The deposition of the copper can proceed by electrochemical deposition such as electroplating or electroless plating. Examples of suitable electroplating compositions are disclosed in U.S. patent application Ser. No. 09/348,632, assigned to International Business Machines, the entire disclosure of which is incorporated herein by reference.

Most often those skilled in the art will then use a chemical mechanical polishing (CMP) process to remove the overabundant materials of layers 4, 5 and 6 present on the top surface of the substrate to provide a planarized structure having a copper surface flush with the top surface of the dielectric material 2. If desired, CMP, e-CMP or RIE processing can be performed prior to depositing the copper if the copper is deposited using electroless deposition.

Following the CMP process a non-selective capping material can be deposited on the top exposed surfaces of the copper and dielectric. The non-selective capping material can be any type of material known to those skilled in the art.

Alternatively, another aspect of this invention is to deposit a capping material of a CoWP film of the invention. In this way, the CoWP film is used as both a barrier layer within the trench or via as well as a capping material.

Figure 4A:
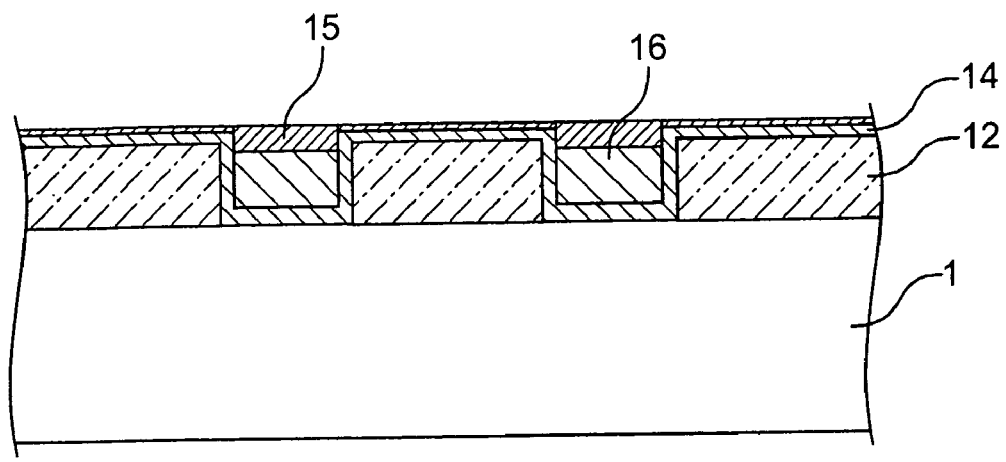
FIG. 4A is a schematic representation of an interconnect structure of one embodiment of the invention.

In one embodiment, small amounts of copper can be etched from the copper layer by electroetch or electrochemical polishing to provide a copper interconnect structure 16 having a top copper surface below the top surface of the dielectric 12. Such a structure is shown in FIG. 4A, and is referred to as a recessed structure. A barrier layer 14 is deposited on the sidewall and bottom surfaces of the trench. Of course, barrier layer 14 can comprise one or more metal layers known to those of ordinary skill in the art. Also, barrier layer 14 can provide for direct copper electrodeposition in standard copper acid baths used in the microelectronic industry without the need for a seed layer. Following the deposition of the conducting copper layer 16, the CoWP film 15 is then deposited on top of the copper surface using the barrier layer 14 as the current carrier from the edge to the center of the substrate.

One advantage of using a CoWP capping layer to fill and top the composite structure is that the CoWP film tends to preferentially deposit on the copper and not barrier layer 14 as shown. The barrier layer can then be removed from the dielectric by CMP, e-CMP or a RIE processing step.

Figure 4B:
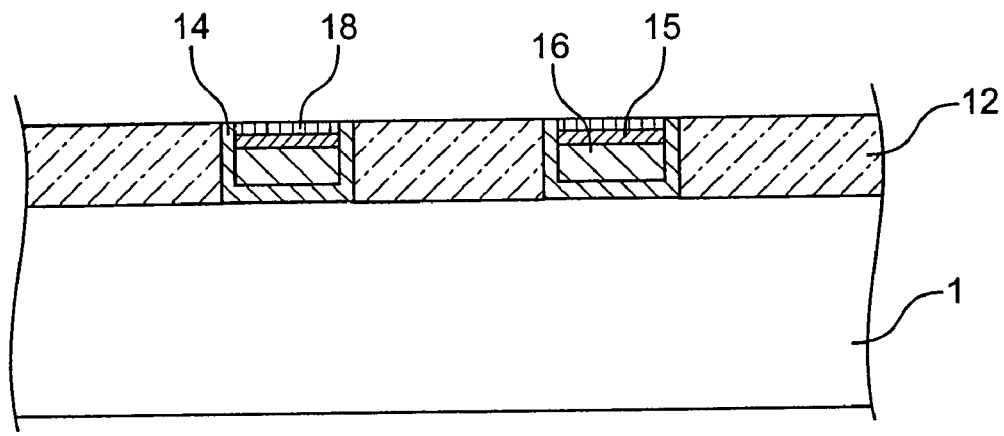
FIG. 4B is a schematic representation of an interconnect structure of another embodiment of the invention

In another embodiment, a metal cap layer 18 containing one or more metals selected from palladium, ruthenium, rhodium, osmium and rhenium, preferably ruthenium, is deposited on the CoWP layer. The metal cap layer 18 can be deposited using the same electroplating method used to deposit CoWP or another deposition method known to those skilled in the art can be used. After the dual layer is in place, the barrier layer can be removed from the dielectric by CMP, e-CMP or RIE processing as shown in FIG. 4B.

Figure 5:
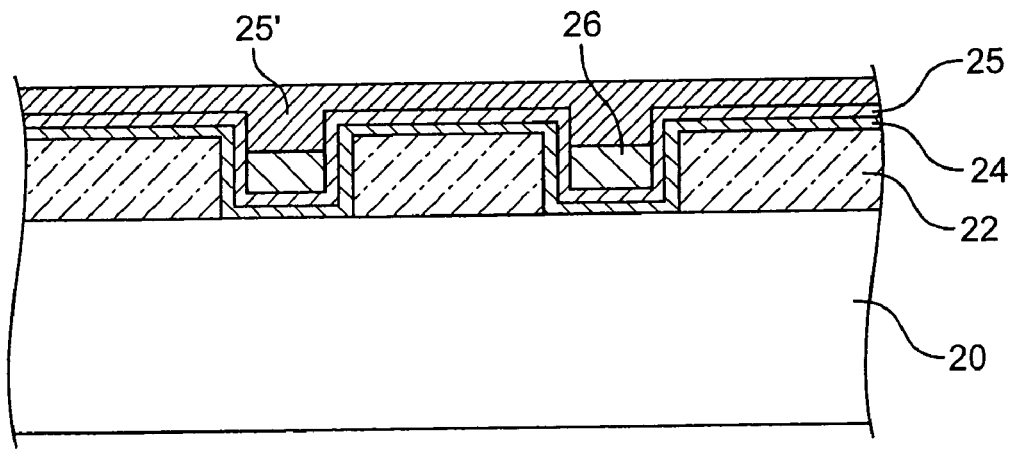
FIG. 5 is a schematic representation of an interconnect structure of another embodiment of the invention.

In another embodiment, the method of the invention can include providing an interconnect structure with substrate 20 and dielectric material 22 as shown in FIG. 5. A first metal layer 24 is deposited followed by a CoWP film 25 of the invention. The copper conducting layer 26 is deposited, preferably by electroplating. An electrochemical polishing step can be used to form the recessed structure as shown, and a CoWP film 25' is then deposited atop the copper structure. A CMP process can then be used to remove the overabundant materials of layers 24, 25 and 25' to provide a planarized structure.

A preferred barrier layer of the invention is described in U.S. patent application Ser. No. 10/132,173, filed Apr. 26, 2002, and Ser. No. 10/279,057, filed Oct. 24, 2002, both of which are assigned to International Business Machines, the entire disclosures of which are incorporated herein by reference.

Dielectric layers 2, 12 and 22 can be any suitable dielectric layer used in the semiconductor manufacturing industry such as an oxide, e.g., silicon dioxide, nitride, silicon nitride, or an oxynitride layer. Low-k dielectric materials, e.g., SiLK® from Dow Chemical, Coral® from Novellus, Black Diamond® from Applied Materials and spin-on silicon-based dielectrics, can also be used. The Coral® can be described generically as a SiCOH dielectric. The dielectric layer can be formed by any of various methods, including by chemical vapor deposition and spin-on techniques. Dielectric materials described in U.S. Pat. No. 6,147,009, which issued Nov. 14, 2000, and U.S. Pat. No. 6,441,491, which issued on Aug. 27, 2002, the entire disclosures of which are incorporated herein by reference, and both of which are assigned to International Business Machines, can also be used to form the interconnect structures of the invention.

The following non-limiting examples are presented to further illustrate the invention.

EXAMPLES

The CoWP films of the invention were electroplated on a composite structure substrate comprising a blanket p-Si with a TaN/Ta barrier layer, a PVD copper seed layer and an electroplated copper layer of dimension 4×4 cm. The electroplating process included a modified rotating disc electrode controlled by a power supply, which operated with a Pine Instruments system. The modified rotating disc electrode included a metal shaft screwed into a plug which contained a metal top surface and Teflon sample holder with a recessed insert. Four contact pins placed through the plug held the sample in place in the insert and provided the path for the current.

The agitation of the samples was between 50 and 200 rpm and the current density was varied between 5 and 10 mA/cm$^2$. The pH of the electroplating solutions was varied from 4 to 9 by adding sulfuric acid or sodium hydroxide to the solutions as necessary. The temperature of the solutions was controlled by a double jacketed cell and ranged from room temperature to 50° C. The anode was a platinized titanium mesh electrode. The time was controlled by an automatic timing device. The plating times were varied to give different CoWP film thickness. The samples were weighed before and after plating to determine plating rates. The CoWP films were analyzed by Rutherford backscattering spectroscopy (RBS) for composition and thickness. X-ray diffraction (XRD) was used to determine the degree of crystallinity of the films.

XRD was used to analyze the CoWP films following electrodeposition, and if the films were not completely crystalline following the thermal anneal, the annealed film was again analyzed by XRD. In the amorphous films, the only peaks observed were due to Cu and Ta in the substrate. In the crystallized films, the material phases observed were due to Co(hcp) and Co$_2$P. Tungsten compounds were not detected.

The following electroplating solutions were prepared with the concentration of various components and depositing conditions provided in Table 1. CoWP films prepared from bath solutions A, B and E provided stable amorphous CoWP films. Comparable CoWP films C and D were prepared from bath solutions C and D, respectively.

TABLE 1

| Composition | Bath A | Bath B | Bath C | Bath D | Bath E |
|---|---|---|---|---|---|
| Cobalt Sulfate | 0.34M | 0.51M | 0.17M | 0.51M | 0.39M |
| Sodium Tungstate | 0.04M | 0.03M | — | — | 0.06M |
| Phosphotungstic Acid | — | — | 0.006M | 0.006M | — |
| Sodium Citrate | 0.68M | 0.68M | 0.20M | 0.82M | 0.70M |
| Boric Acid | 0.48M | 0.48M | 0.48M | — | 0.48M |
| Sodium Hypophosphite | 0.05M | 0.05M | 0.38M | 0.05M | 0.05M |
| Surfactant | 0.05 g/l | — | 0.1 g/l | 0.1 g/l | 0.05 g/l |
| pH | 8.8 | 9 | 6 | 6 | 8.8 |
| Temperature, ° C. | 40 | 50 | 35 | 35 | 78.5 |

X-ray Photoelectron Spectroscopy (XPS) was done on preannealed and annealed samples to determine the effectiveness of the CoWP as a copper diffusion barrier. Various CoWP films were examined before and after a 4 hour, 400° C., forming gas anneal using XPS. The XPS measurements were made using Al k X-rays and quantifications were assessed using atomic sensitivity factors calibrated for the custom chamber used.

XPS is a surface analysis technique which provides chemical composition information of the top ~40 angstroms of the sample. XPS measurements taken prior to anneal provided a baseline composition of the film, which was compared with, and verified by RBS analysis. Comparable measurements were then taken after the anneal and a careful analysis was made to look for the presence of copper at the surface of the CoWP film. Copper on the film surface indicated copper from the underlying film had been thermally driven through the CoWP film. A correlation was observed between the XRD data and the XPS date provided in-part in Table 2. The data suggested that crystalline films are relatively poor diffusion barriers compared to the amorphous CoWP films of the invention.

It is to be understood, that the term "amorphous", as used to describe the CoWP films of the invention, defines CoWP films that exhibit little, if any, crystalline features in the x-ray diffraction spectra of the film. The term "amorphous" also includes CoWP films that are nanocrystalline because it is very difficult to detect nanocrystalline material using x-ray diffraction.

In some instances, the CoWP films of the invention can exhibit some peaks in the x-ray spectra, characteristic of certain crystalline material in the film, however, the process of the invention allows one to minimize such features. One skilled in the art would certainly recognize that the CoWP films of the invention, in particular, those films that have been annealed, contain less features characteristic of crystalline material than comparable electroless CoWP films. Also, if there is crystalline material in the CoWP films, the crystalline material is not likely to be interconnected by their respective grain boundaries.

Figure 6:
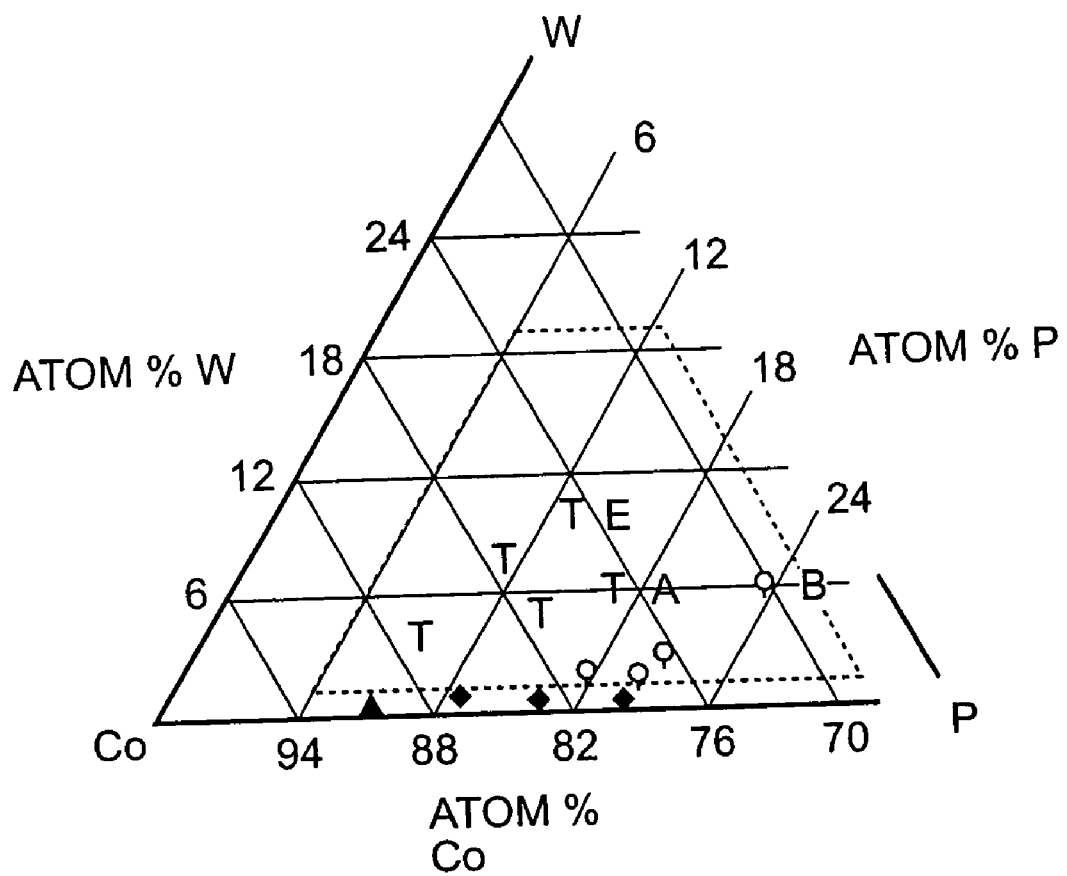
FIG. 6 is a partial ternary composition diagram representative in-part of electroplated COWP films of the invention.

From the XRD data of various electroplated CoWP films deposited on copper surfaces the ternary composition diagram of FIG. 6 was constructed. As shown, some of the electroplated CoWP films were crystalline following 400° C. anneal for 30 minutes (▲), substantially crystalline following 400° C. anneal for 30 minutes (◊), amorphous as deposited but turned partially crystalline following 400° C. anneal for 4 hours (O), or amorphous as deposited and exhibited little, or no crystalline structure following anneal (T).

The CoWP films with an atomic composition within the dotted trapezoid will, in most instances, provide thermally stable films of the invention. Those films defined by an atomic composition closer to the sides of the trapezoid are less likely to provide thermally stable films.

TABLE 2

| Example | Thickness (nm) | initial atom % | | | Post-anneal atom % Cu/atom % Co |
|---|---|---|---|---|---|
| | | Co | W | P | |
| A | 20 | 77.6 | 5.9 | 16.5 | 0.010 |
| E2 | 27 | 78.9 | 5.6 | 15.5 | 0.004 |
| F | 15 | 73.9 | 1.1 | 25 | 0.127 |

Example A

CoWP film A prepared from bath solution A was deposited at 40° C., 100 rpms, and 6.3 mA/cm². The deposited film was annealed to 400° C. for 4 hours in forming gas (5% $H_2$ in $N_2$) and showed no crystallinity. The CoWP film A had an atomic percent concentration of 77.6/5.9/16.5 of Co, W and P, respectively, by RBS analysis, and a film thickness of about 160 nm.

Figure 7A:
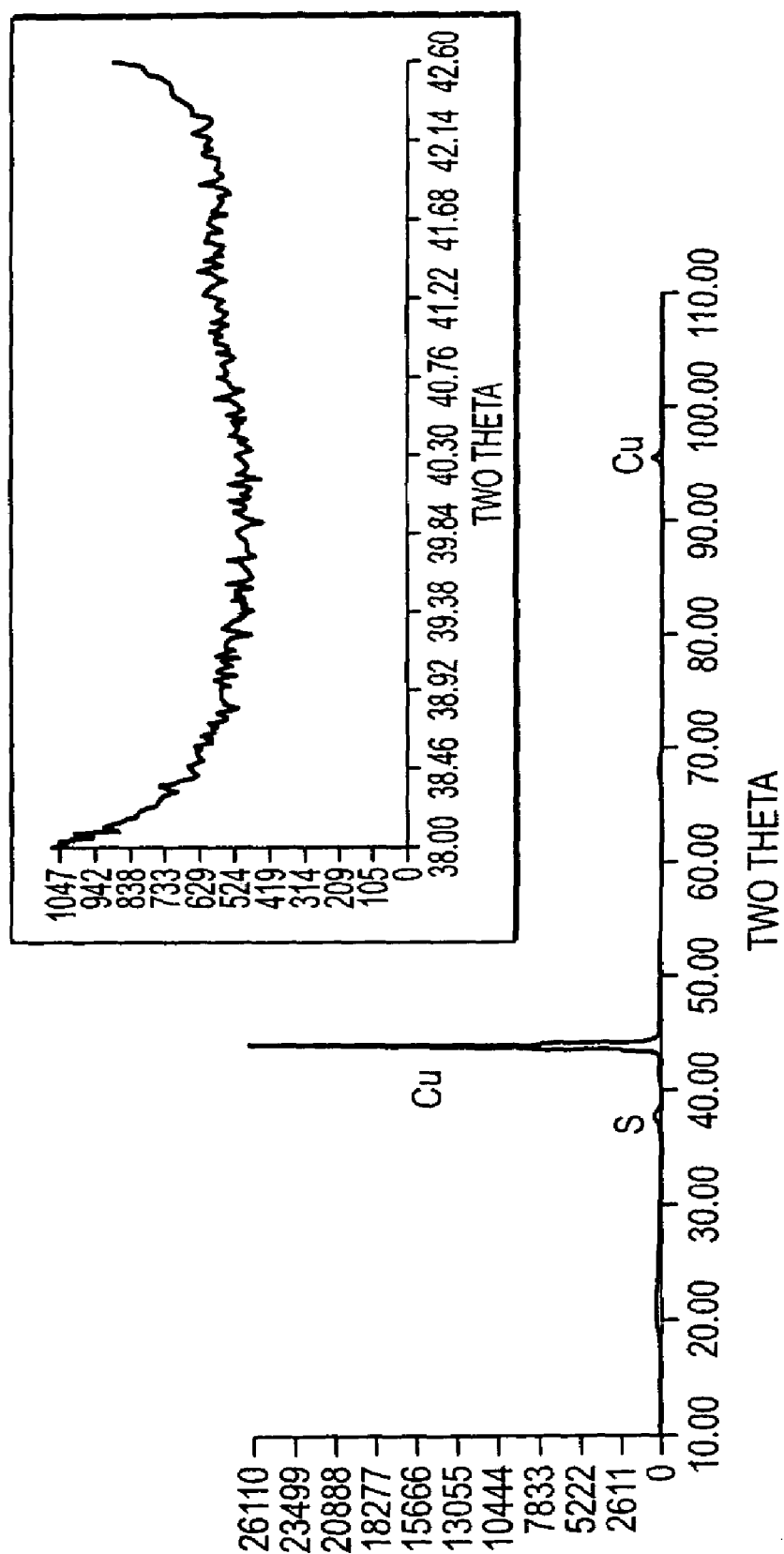
FIGS. 7A and 7B are representative x-ray diffraction spectra of the CoWP films of the invention.

The x-ray diffraction spectrum of Example A is provided in FIG. 7A. The spectrum was obtained following a 400° C. anneal for 4 hours. A slow run data set (shown as inset) from 38 2θ to 42.6 2θ indicates virtual absence of a crystalline $Co_2P$ peak at ca. 41°2θ.

Example B

CoWP film B prepared from bath solution B was deposited at 50° C., 100 rpms, and 5 mA/cm². The deposited film was annealed at 400° C. for about 30 minutes in forming gas. At the end of the 30 minute anneal the film exhibited no crystalline structure by XRD. Following an additional anneal of 4 hours under the same conditions, CoWP film B exhibited very little crystalline structure by XRD (a single, weak intensity $Co_2P$ (121) peak; no other phases identified). The CoWP film B had an atomic percent concentration of 70/6/24 of Co, W and P respectively, and a thickness of about 100 nm Example E CoWP film E prepared from bath solution E was deposited at 78.5° C., 100 rmps and 6.3 mA/cm². The film showed no crystallinity after a four hour annealing. CoWP film E has an atomic percent concentration of 76.9/9.9/13.2 of Co, W and P, respectively. CoWP film E2 prepared from bath solution E was deposited at 40° C., 100 rpms and 6.3 mA/cm². The atomic % Cu/atomic % Co ratio provided in Table 2 was determined from XPS after a four hour anneal at 400° C.

Example F

Figure 7B:
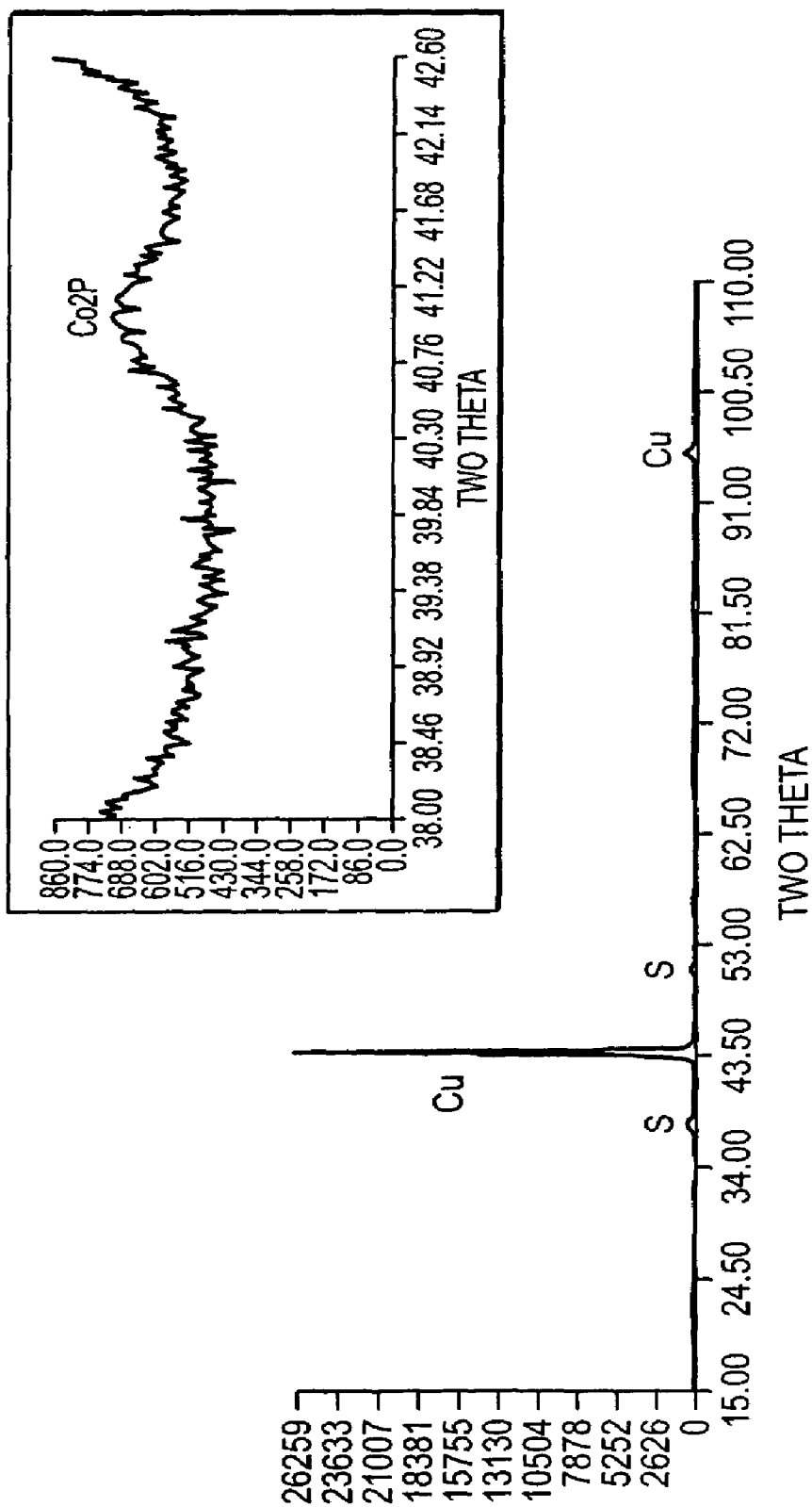

CoWP film F was deposited at about 23° C., 100 rpms and 8.5 mA/cm². The film showed no crystallinity after a four hour annealing. CoWP film F has an atomic percent concentration of 73.9/1.1/25 of Co, W and P, respectively. The x-ray diffraction spectrum of Example F is provided in FIG. 7B. The spectrum was obtained following a 400° C. anneal for 4 hours. A slow run data set (shown as inset) from 38 2θ to 42.6 2θ shows a small peak assigned to crystalline $Co_2P$ at ca. 41°2θ.

Comparative Example C

Figure 8A:
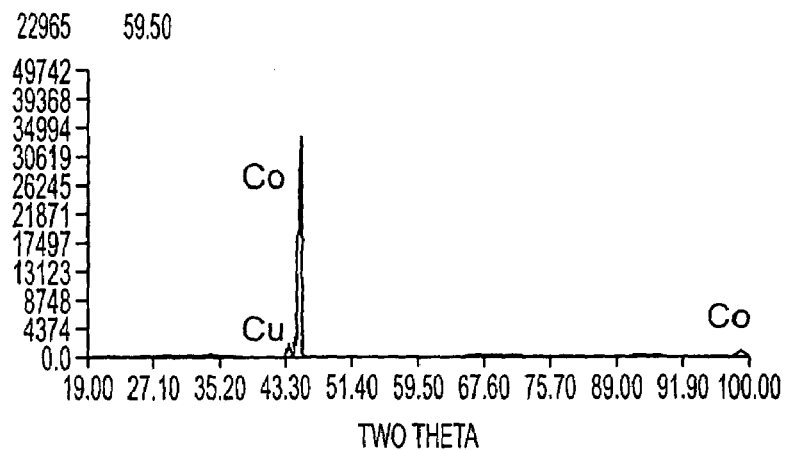
FIGS. 8A and 8B are representative x-ray diffraction spectra of comparative CoWP films.

A comparative CoWP film (C) prepared from bath solution C was deposited at 35° C., 50 rpms and 5 mA/cm². The film was crystalline as deposited. CoWP film C had an atomic percent concentration of 92/0.1/8 atomic percent of Co, W and P, respectively. The x-ray diffraction spectra for Comparative Example C is shown in FIG. 8A.

Comparative Example D

Figure 8B:
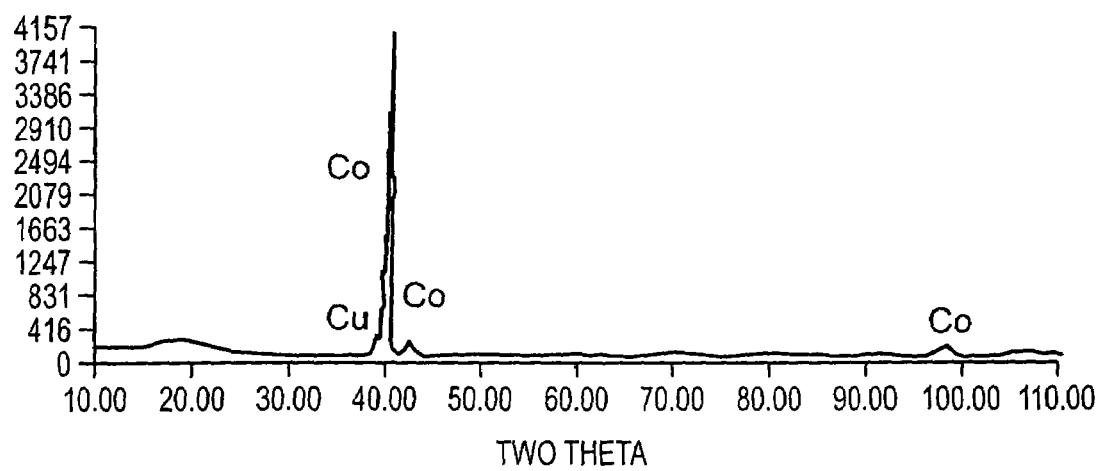

A comparative CoWP film (D) prepared from bath solution D was deposited at 35° C., 200 rpms and 5 mA/cm². The film was initially glassy as deposited and exhibited strong peaks in the XRD after annealing for 30 mins to 400° C. in forming gas. CoWP film D had an atomic percent concentration of 91/0.2/8.8 atomic percent of Co, W and P, respectively. The x-ray diffraction spectra for Comparative Example D is shown in FIG. 8B.

What is claimed:

1. A method of making an interconnect structure comprising:
   providing a trench or via within a dielectric material, and a conducting metal containing copper within the trench or the via; and
   forming a CoWP film by electrodeposition on the copper layer, wherein the CoWP film contains 10 atom percent to 25 atom percent phosphorus.

2. The method of claim 1 wherein the CoWP film contains from 3 atom percent to 10 atom percent tungsten as measured by Rutherford backscattering spectroscopy.

3. The method of claim 1 wherein the CoWP film consists essentially of $Co_xW_yP_z$, wherein $0.68<x<0.88$; $0.01<y<0.10$; and $z=(1-(x+y))$ as measured by Rutherford backscattering spectroscopy.

4. The method of claim 3 wherein $0.77<x<0.83$ and $0.03<y<0.07$.

5. The method of claim 1 further comprising depositing a metal layer along the sidewalls of the trench or via, wherein the copper layer is disposed between the CoWP film and the metal layer.

6. The method of claim 1 further comprising removing a portion of the copper conducting metal to form a recessed structure prior to forming the CoWP film.

7. The method of claim 6 further comprising forming a metal cap layer on the CoWP film.

8. The method of claim 1 wherein the CoWP film has a thickness from 5 nm to 50 nm.

9. The method of claim 1 wherein forming the CoWP film comprises providing an electroplating bath solution at a pH from 7 to 10.

10. The method of claim 9 wherein forming the CoWP film comprises applying a current density of 3 mA/cm² to 20 mA/cm².

11. The method of claim 9 wherein Conning the CoWP films comprises applying a current density of 6 mA/cm² to 12 mA/cm².

12. The method of claim 1 wherein the atom percent phosphorous is measured by Rutherford backscattering spectroscopy.

13. The method of claim 1 wherein forming the CoWP films comprises providing an electroplating bath solution at a pH from 8 to 9.

14. The method of claim 1 further comprising annealing the electrodeposited CoWP film in the presence of forming gas.

15. The method of claim 1, wherein the CoWP film contains from 13.2 atom percent phosphorus to 25 atom percent phosphorus.

16. The method of claim 1, wherein the CoWP film contains from 16.5 atom percent phosphorus to 25 atom percent phosphorus.

17. A method of making an interconnect structure comprising;
    providing a tench or via in a dielectric layer, wherein the trench or the via has sidewall surfaces in contact with a metal layer;
    forming a CoWP film by electrodeposition on the metal layer, wherein the CoWP film contains 10 atom percent to 25 atom percent phosphorus; and
    forming a copper layer on the CoWP film.

18. The method of claim 17 wherein forming the CoWP films comprises providing an electroplating bath solution at a pH from 7 to 10.

19. The method of claim 18 wherein forming the CoWP films comprises applying a current density of 3 mA/cm$^2$ to 20 mA/cm$^2$.

20. The method of claim 18 wherein forming the CoWP films comprises applying a current density of 6 mA/cm$^2$ to 12 mA/cm$^2$.

21. The method of claim 17 wherein forming the CoWP films comprises maintaining the electroplating both solution at a pH from 8 to 9.

22. The method of claim 17 further comprising removing a portion of the copper conducting metal to form a recessed structure and forming a CoWP cap on the recessed copper conducting metal.

23. The method of claim 17 wherein the CoWP film has a thickness from 5 nm to 30 nm.

24. The method of claim 17, wherein the CoWP film contains from 13.2 atom percent phosphorus to 25 atom percent phosphorus.

25. The method of claim 17, wherein the CoWP film contains from 16.5 atom percent phosphorus to 25 atom percent phosphorus.

* * * * *